(12) United States Patent
Liu et al.

(10) Patent No.: US 10,552,055 B2
(45) Date of Patent: *Feb. 4, 2020

(54) MULTI-TIER SCHEME FOR LOGICAL STORAGE MANAGEMENT

(71) Applicant: Western Digital Technologies, Inc., San Jose, CA (US)

(72) Inventors: Haining Liu, Irvine, CA (US); Yuriy Pavlenko, Mission Viejo, CA (US); George G. Artnak, Jr., Yorba Linda, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/370,811

(22) Filed: Mar. 29, 2019

(65) Prior Publication Data

US 2019/0227720 A1 Jul. 25, 2019

Related U.S. Application Data

(63) Continuation of application No. 15/445,921, filed on Feb. 28, 2017, now Pat. No. 10,289,314, which is a continuation of application No. 14/498,566, filed on Sep. 26, 2014, now Pat. No. 9,582,201.

(51) Int. Cl.
*G11C 11/34* (2006.01)
*G11C 16/04* (2006.01)
(Continued)

(52) U.S. Cl.
CPC ............ *G06F 3/0613* (2013.01); *G06F 3/064* (2013.01); *G06F 3/0635* (2013.01);
(Continued)

(58) Field of Classification Search
CPC ...... G06F 3/0613; G06F 3/064; G06F 3/0659; G06F 3/0665; G06F 3/0688;
(Continued)

(56) References Cited

U.S. PATENT DOCUMENTS 6,754,785 B2 6/2004 Chow et al.
7,496,879 B2 * 2/2009 Rohe ................... G06F 17/5054
716/134
(Continued)

FOREIGN PATENT DOCUMENTS

CN 103370698 10/2013

OTHER PUBLICATIONS

"Memory Management in NAND Flash Arrays," Micron Technology, Technical Note, TN-29-28, 2005, 10 pp.
(Continued)

*Primary Examiner* — Toan K Le
(74) *Attorney, Agent, or Firm* — Morgan, Lewis & Bockius LLP (57) ABSTRACT

A storage device may include a controller and a memory array including a plurality of dies arranged into a plurality of channels. In some examples, the controller may be configured to define, from the memory array, a plurality of die-sets based on respective chip enable lines associated with the plurality of dies, wherein each die-set of the plurality of die-sets includes at least one die from each of the plurality of channels; define, from a selected die-set of the plurality of die-sets, a plurality of blocksets, wherein each blockset includes a block from each die of the selected die-set; receive a unit of data to be stored; and issue commands that cause the unit of data to be stored in blocks of a selected blockset of the plurality of blocksets.

20 Claims, 7 Drawing Sheets

(51) Int. Cl.
*G06F 3/06* (2006.01)
*G11C 8/12* (2006.01)
*G11C 5/02* (2006.01)
*G11C 5/14* (2006.01)
*G11C 29/02* (2006.01)
*G11C 29/26* (2006.01)

(52) U.S. Cl.
CPC .......... *G06F 3/0659* (2013.01); *G06F 3/0665* (2013.01); *G06F 3/0688* (2013.01); *G06F 3/0689* (2013.01); *G11C 5/025* (2013.01); *G11C 5/14* (2013.01); *G11C 8/12* (2013.01); *G11C 29/021* (2013.01); *G11C 29/028* (2013.01); *G11C 2029/2602* (2013.01)

(58) Field of Classification Search
CPC ......... G06F 3/0689; G11C 5/025; G11C 5/14; G11C 8/12; G11C 29/021; G11C 2029/2602
See application file for complete search history.

(56) References Cited

U.S. PATENT DOCUMENTS

| | | | |
|---|---|---|---|
| 8,266,367 B2 | 9/2012 | Yu et al. | |
| 8,386,700 B2 | 2/2013 | Olbrich et al. | |
| 8,495,332 B2 | 7/2013 | Wakrat et al. | |
| 8,495,471 B2 | 7/2013 | Antonakopoulos et al. | |
| 8,572,311 B1 | 10/2013 | Shalvi et al. | |
| 8,650,362 B2 | 2/2014 | de la Iglesia et al. | |
| 8,724,517 B1* | 5/2014 | Bulusu | H04L 45/48 370/254 |
| 9,582,201 B2 | 2/2017 | Liu et al. | |
| 10,289,314 B2* | 5/2019 | Liu | G11C 5/025 |
| 2010/0174851 A1 | 7/2010 | Lieibowitz et al. | |
| 2010/0250826 A1 | 9/2010 | Jeddeloh | |
| 2010/0262762 A1 | 10/2010 | Borchers et al. | |
| 2011/0185105 A1* | 7/2011 | Yano | G06F 12/0246 711/103 |
| 2011/0302361 A1 | 12/2011 | Yamazaki | |
| 2012/0079167 A1 | 3/2012 | Yao | |
| 2012/0198129 A1 | 8/2012 | Van Aken et al. | |
| 2012/0284454 A1 | 11/2012 | Klein | |
| 2013/0132652 A1 | 5/2013 | Wood et al. | |
| 2013/0205102 A1 | 8/2013 | Jones et al. | |
| 2013/0265825 A1 | 10/2013 | Lassa | |
| 2014/0015085 A1 | 1/2014 | Ikeda et al. | |
| 2014/0029341 A1 | 1/2014 | In | |

OTHER PUBLICATIONS

Dastur et al., "Design of a 4-Channel 16-Bit Solid State Drive," IP-ESC'09 Conference, Dec. 1-3, 2009, 3 pp.

* cited by examiner

MULTI-TIER SCHEME FOR LOGICAL STORAGE MANAGEMENT

CROSS-REFERENCE TO RELATED APPLICATIONS

This application is a continuation of U.S. application Ser. No. 15/445,921 filed on Feb. 28, 2017, now U.S. Pat. No. 10,289,314, which is a continuation of U.S. application Ser. No. 14/498,566 filed on Sep. 26, 2014, now U.S. Pat. No. 9,582,201, the entirety of each of which is incorporated herein by reference.

TECHNICAL FIELD

This disclosure relates to logical storage management, and more particularly, to logical storage management for solid state drives.

BACKGROUND

Memory devices may include internal, semiconductor, integrated circuits in computers or other electronics devices. There are many different types of memory including random-access memory (RAM), read only memory (ROM), dynamic random access memory (DRAM), static RAM (SRAM), and synchronous dynamic RAM (SDRAM). Memory may be non-volatile memory or volatile memory.

The main difference between non-volatile memory and volatile memory is that non-volatile memory may continue to store data without requiring a persistent power supply. As a result, non-volatile memory devices have developed into a popular type of memory for a wide range of electronic applications. One type of non-volatile memory includes flash memory. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) may be stored in flash memory devices for personal use in personal computer systems.

Non-volatile memory devices, including flash memory devices, are also incorporated into solid-state storage devices, such as solid-state drives (SSDs).

SUMMARY

In one example, a storage device may include a memory array including a plurality of dies arranged into a plurality of channels and a controller. In some examples, the controller may be configured to define, from the memory array, a plurality of die-sets based on respective chip enable lines associated with the plurality of dies, wherein each die-set of the plurality of die-sets includes at least one die from each of the plurality of channels; define, from a selected die-set of the plurality of die-sets, a plurality of blocksets, wherein each blockset includes a block from each die of the selected die-set; receive a unit of data to be stored; and issue commands that cause the unit of data to be stored in blocks of a selected blockset of the plurality of blocksets.

In another example, a method includes defining, from a memory array including a plurality of dies arranged into a plurality of channels, a plurality of die-sets based on respective chip enable lines associated with the plurality of dies, wherein each die-set of the plurality of die-sets includes at least one die from each of the plurality of channels, and defining, from a selected die-set of the plurality of die-sets, a plurality of blocksets, wherein each blockset includes a block from each die of the selected die-set. In this example, the method also includes receiving, by a controller of the memory array, a unit of data to be stored; and issuing, by the controller, commands that cause the unit of data to be stored in blocks of a selected blockset of the plurality of blocksets.

In another example, a computer-readable storage medium stores instructions that, when executed, cause one or more processors of a storage device to: define, from a memory array including a plurality of dies arranged into a plurality of channels, a plurality of die-sets based on respective chip enable lines associated with the plurality of dies, wherein each die-set of the plurality of die-sets includes at least one die from each of the plurality of channels; and define, from a selected die-set of the plurality of die-sets, a plurality of blocksets, wherein each blockset includes a block from each die of the selected die-set. In this example, the computer-readable storage medium also stores instructions that, when executed, cause one or more processors of the storage device to receive a unit of data to be stored; and issue commands that cause the unit of data to be stored in blocks of a selected blockset of the plurality of blocksets.

In another example, a system includes means for defining, from a memory array including a plurality of dies arranged into a plurality of channels, a plurality of die-sets based on respective chip enable lines associated with the plurality of dies, wherein each die-set of the plurality of die-sets includes at least one die from each of the plurality of channels; and means for defining, from a selected die-set of the plurality of die-sets, a plurality of blocksets, wherein each blockset includes a block from each die of the selected die-set. In this example, the system also includes means for receiving a unit of data to be stored; and means for issuing commands that cause the unit of data to be stored in blocks of a selected blockset of the plurality of blocksets.

The details of one or more examples are set forth in the accompanying drawings and the description below. Other features, objects, and advantages will be apparent from the description and drawings, and from the claims.

DETAILED DESCRIPTION

To improve throughput using parallelism, an SSD controller may implement a backend management scheme by grouping together multiple physical flash blocks located on different channels and chip enable (CE) lines to form logical containers. The SSD controller may then utilize these logical containers as a basic operation unit for a logical management domain.

In some examples, the controller may construct the logical container by selecting a respective physical flash block from each target (e.g., CE line) for each physical channel. By doing so, the controller may fill all the flash blocks in the logical container concurrently and the system can achieve full potential in I/O throughput. For example, for a controller with 16 physical channels and 8 CEs, a logical container size may be 128 physical blocks (16 channels times 8 CEs). However, in some examples, it may not be desirable to select a block from each of the memory devices.

In general, this disclosure describes techniques for using a two-tier partition scheme to manage a storage device. In some examples, a controller of a storage device may define the first tier by partitioning an array of memory devices into a plurality of die-sets that may each include at least one memory devices from each channel of the array. The controller may define the second tier by defining a plurality of blocksets from each of the plurality of die-sets such that each blockset of the plurality of blocksets includes at least one block from each respective memory device in the die set. The controller may then utilize the blocksets as basic units of a logical management domain. For example, a controller with has 8 CEs and 16 channels may implement the techniques of this disclosure by partitioning all the memory devices into 8 die-sets, with each die-set containing a respective memory device from each channel. In this example, the blocksets may each include 16 physical flash blocks, one block from each of the 16 channels. In this way, the controller may reduce the number of blocks included in the basic units of the logical management domain, e.g., without compromising potential throughput.

Additionally, this disclosure describes techniques for dynamically scheduling the number of active memory devices based on different power consumption budgets, performance targets, or both. For instance, the controller may determine, in run-time, a quantity of memory devices that may be concurrently active, e.g., to meet a power consumption budge or performance target. Based on the determined quantity, the controller may schedule to write, read, or both concurrently to one or more die-sets (any number of die-sets between one and the number of die-sets of the storage device). Increasing the number of concurrently active die-sets may increase I/O performance of the storage device while increasing the power consumed by the storage device. Conversely, decreasing the number of concurrently active die-sets may decrease I/O performance of the storage device while decreasing the power consumed by the storage device. In this way, the controller may dynamically schedule the number of active memory devices to comply with different power consumption budgets, performance targets, or both.

Figure 1:
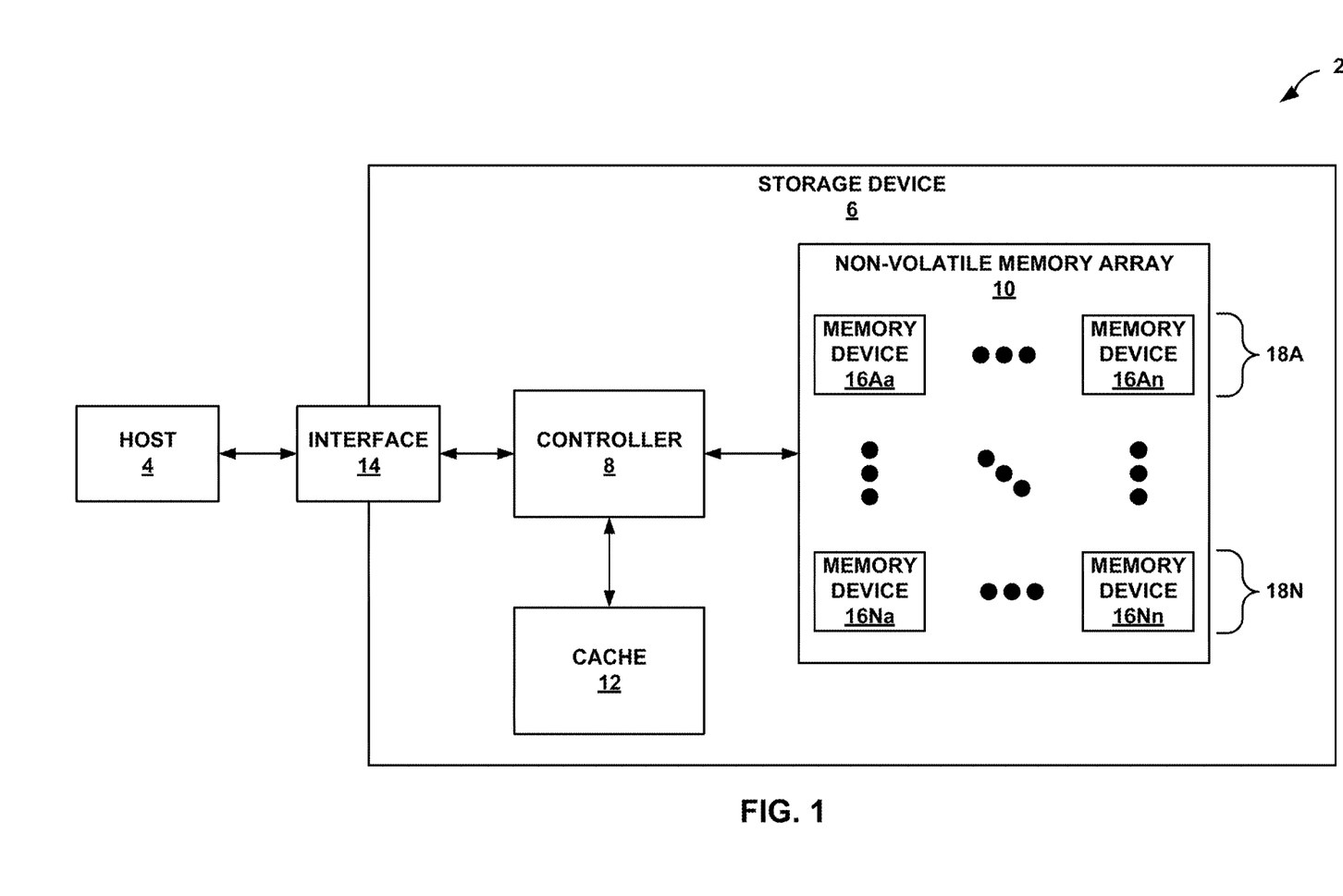
FIG. 1 is a conceptual and schematic block diagram illustrating an example storage environment in which a storage device may function as a storage device for a host device, in accordance with one or more techniques of this disclosure

FIG. 1 is a conceptual and schematic block diagram illustrating an example storage environment 2 in which storage device 6 may function as a storage device for host device 4, in accordance with one or more techniques of this disclosure. For instance, host device 4 may utilize non-volatile memory devices included in storage device 6 to store and retrieve data. In some examples, storage environment 2 may include a plurality of storage devices, such as storage device 6, that may operate as a storage array. For instance, storage environment 2 may include a plurality of storages devices 6 configured as a redundant array of inexpensive/independent disks (RAID) that collectively function as a mass storage device for host device 4.

Storage environment 2 may include host device 4 which may store and/or retrieve data to and/or from one or more storage devices, such as storage device 6. As illustrated in FIG. 1, host device 4 may communicate with storage device 6 via interface 14. Host device 4 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

As illustrated in FIG. 1 storage device 6 may include controller 8, non-volatile memory array 10 (NVMA 10), cache 12, and interface 14. In some examples, storage device 6 may include additional components not shown in FIG. 1 for sake of clarity. For example, storage device 6 may include power delivery components, including, for example, a capacitor, super capacitor, or battery; a printed board (PB) to which components of storage device 6 are mechanically attached and which includes electrically conductive traces that electrically interconnect components of storage device 6; and the like. In some examples, the physical dimensions and connector configurations of storage device 6 may conform to one or more standard form factors. Some example standard form factors include, but are not limited to, 3.5" hard disk drive (HDD), 2.5" HDD, 1.8" HDD, peripheral component interconnect (PCI), PCI-extended (PCI-X), PCI Express (PCIe) (e.g., PCIe ×1, ×4, ×8, ×16, PCIe Mini Card, MiniPCI, etc.). In some examples, storage device 6 may be directly coupled (e.g., directly soldered) to a motherboard of host device 4.

Storage device 6 may include interface 14 for interfacing with host device 4. Interface 14 may include one or both of a data bus for exchanging data with host device 4 and a control bus for exchanging commands with host device 4. Interface 14 may operate in accordance with any suitable protocol. For example, interface 14 may operate in accordance with one or more of the following protocols: advanced technology attachment (ATA) (e.g., serial-ATA (SATA), and parallel-ATA (PATA)), Fibre Channel, small computer system interface (SCSI), serially attached SCSI (SAS), peripheral component interconnect (PCI), and PCI-express. The electrical connection of interface 14 (e.g., the data bus, the control bus, or both) is electrically connected to controller 8, providing electrical connection between host device 4 and controller 8, allowing data to be exchanged between host device 4 and controller 8. In some examples, the electrical connection of interface 14 may also permit storage device 6 to receive power from host device 4.

Storage device 6 may include NVMA 10 which may include a plurality of memory devices 16Aa-16Nn (collectively, "memory devices 16") which may each be configured to store and/or retrieve data. For instance, a memory device of memory devices 16 may receive data and a message from controller 8 that instructs the memory device to store the data. Similarly, the memory device of memory devices 16 may receive a message from controller 8 that instructs the memory device to retrieve data. In some examples, each of memory devices 6 may be referred to as a die. In some examples, a single physical chip may include a plurality of dies (i.e., a plurality of memory devices 16). In some examples, each of memory devices 16 may be configured to store relatively large amounts of data (e.g., 128 Mb, 256 Mb, 512 Mb, 1 Gb, 2 Gb, 4 Gb, 8 Gb, 16 Gb, 32 Gb, 64 Gb, 128 Gb, 256 Gb, 512 Gb, 1 Tb, etc.).

Figure 2:
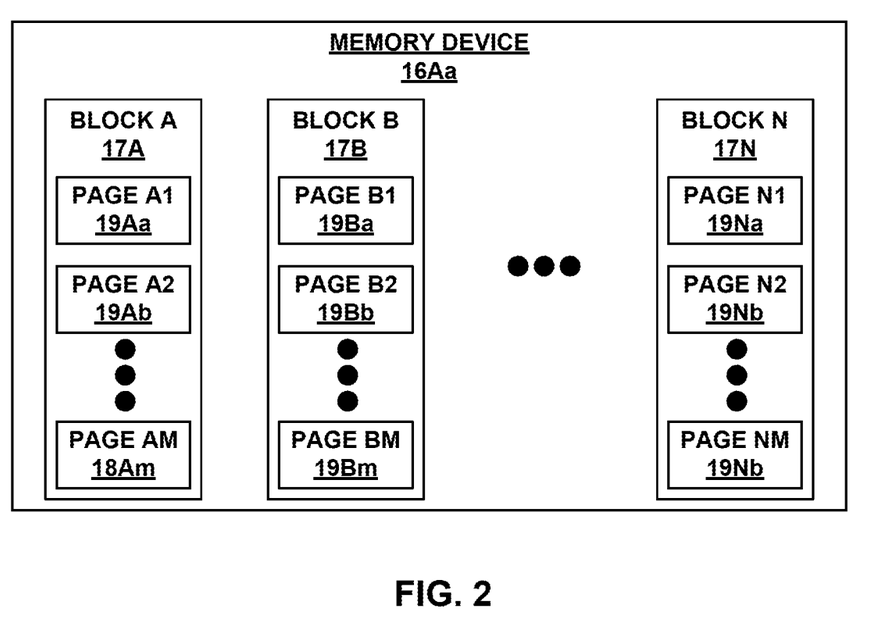
FIG. 2 is a conceptual block diagram illustrating an example memory device that includes a plurality of blocks, each block including a plurality of pages, in accordance with one or more techniques of this disclosure.

In some examples, memory devices 16 may include flash memory devices. Flash memory devices may include NAND or NOR based flash memory devices, and may store data based on a charge contained in a floating gate of a transistor for each flash memory cell. In NAND flash memory devices, the flash memory device may be divided into a plurality of blocks. FIG. 2 is a conceptual block diagram illustrating an example, memory device 16Aa that includes a plurality of blocks 17A-17N (collectively, "blocks 17"), each block including a plurality of pages 19Aa-19Nm (collectively, "pages 19"). Each block of blocks 17 may include a plurality of NAND cells. Rows of NAND cells may be serially electrically connected using a word line to define a page (one page of pages 19). Respective cells in each of a plurality of pages 19 may be electrically connected to respective bit lines. Controller 6 may write data to and reads data from NAND flash memory devices at the page level and erase data from NAND flash memory devices at the block level.

In some examples, it may not be practical for controller 8 to be separately connected to each memory device of memory devices 16. As such, the connections between memory devices 16 and controller 8 may be multiplexed. As an example, memory devices 16 may be grouped into channels 18A-18N (collectively, "channels 18"). For instance, as illustrated in FIG. 1, memory devices 16Aa-16Nn may be grouped into first channel 18A, and memory devices 16Na-16Nn may be grouped into Nth channel 18N. The memory devices 16 grouped into each of channels 18 may share one or more connections to controller 8. For instance, the memory devices 16 grouped into first channel 18A may be attached to a common I/O bus and a common control bus. Storage device 6 may include a common I/O bus and a common control bus for each respective channel of channels 18. In some examples, each channel of channels 18 may include a set of chip enable (CE) lines which may be used to multiplex memory devices on each channel. For example, each CE line may be connected to a respective memory device of memory devices 18. In this way, the number of separate connections between controller 8 and memory devices 18 may be reduced. Additionally, as each channel has an independent set of connections to controller 8, the reduction in connections may not significantly affect the data throughput rate as controller 8 may simultaneously issue different commands to each channel.

In some examples, storage device 6 may include a number of memory devices 16 selected to provide a total capacity that is greater than the capacity accessible to host device 4. This is referred to as over provisioning. For example, if storage device 6 is advertised to include 240 GB of user-accessible storage capacity, storage device 6 may include sufficient memory devices 16 to give a total storage capacity of 256 GB. The 16 GB of storage devices 16 may not be accessible to host device 4 or a user of host device 4. Instead, the additional storage devices 16 may provide additional blocks 17 to facilitate writes, garbage collection, wear leveling, and the like. Further, the additional storage devices 16 may provide additional blocks 17 that may be used if some blocks wear to become unusable and are retired from use. The presence of the additional blocks 17 may allow retiring of the worn blocks without causing a change in the storage capacity available to host device 4. In some examples, the amount of over-provisioning may be defined as $p=(T-D)/D$, wherein p is the over-provisioning ratio, T is the total storage capacity of storage device 2, and D is the storage capacity of storage device 2 that is accessible to host device 4.

Figure 3:
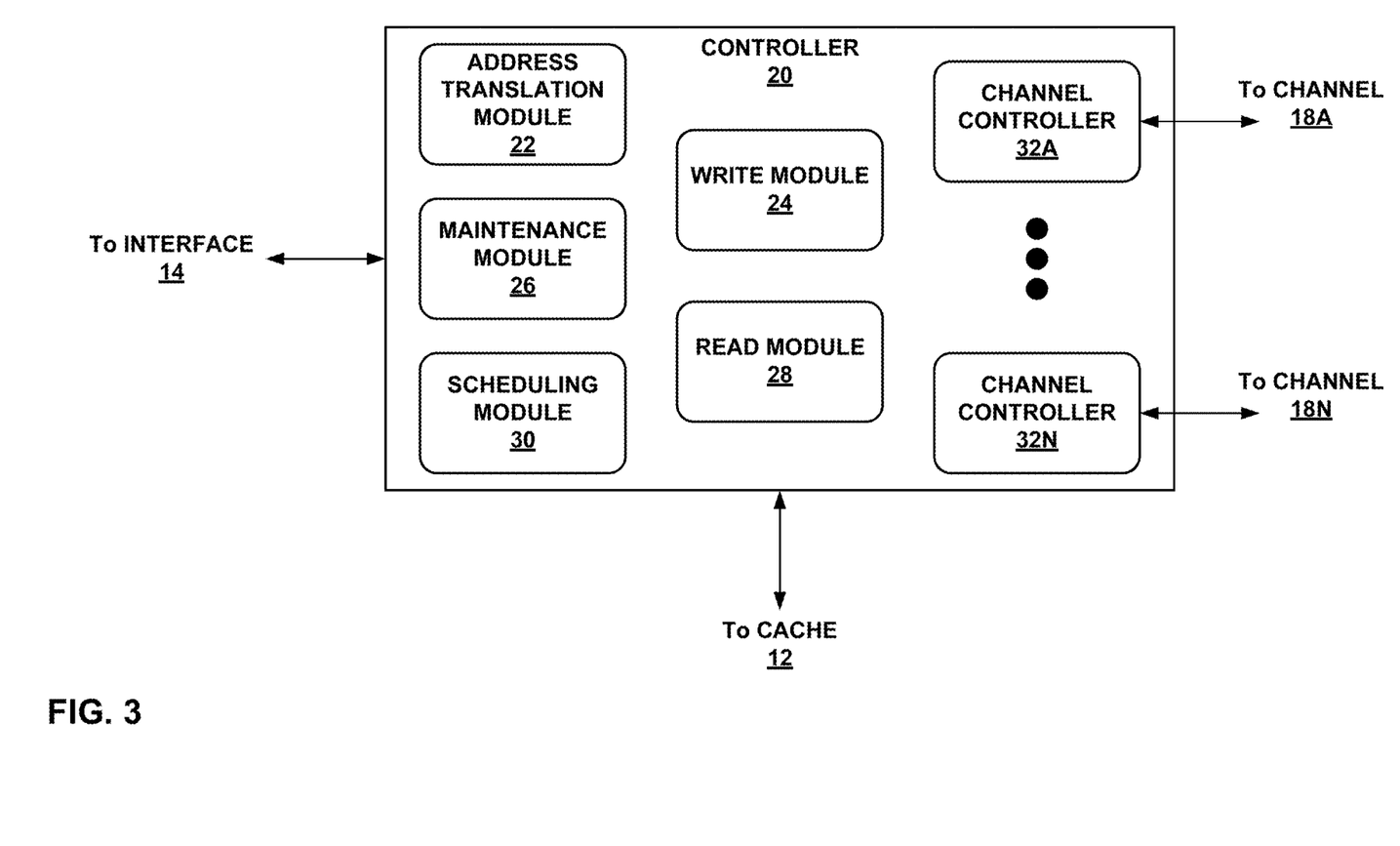
FIG. 3 is a conceptual and schematic block diagram illustrating an example controller, in accordance with one or more techniques of this disclosure.

Storage device 6 includes controller 8, which may manage one or more operations of storage device 6. FIG. 3 is a conceptual and schematic block diagram illustrating an example controller 20, which may be an example of controller 6 in FIG. 1. In some examples, controller 20 may include an address translation module 22, a write module 24, a maintenance module 26, a read module 28, a scheduling module 30, and a plurality of channel controllers 32A-32N (collectively, "channel controllers 28"). In other examples, controller 20 may include additional modules or hardware units, or may include fewer modules or hardware units. Controller 20 may include a microprocessor, digital signal processor (DSP), application specific integrated circuit (ASIC), field programmable gate array (FPGA), or other digital logic circuitry.

Controller 20 may interface with the host device 4 via interface 14 and manage the storage of data to and the retrieval of data from memory devices 16. For example, write module 24 of controller 20 may manage writes to memory devices 16. For example, write module 24 may receive a message from host device 4 via interface 14 instructing storage device 6 to store data associated with a logical address and the data. Write module 24 may manage writing of the data to memory devices 16.

For example, write module 24 may communicate with address translation module 22, which manages translation between logical addresses used by host device 4 to manage storage locations of data and physical block addresses used by write module 24 to direct writing of data to memory devices. Address translation module 22 of controller 20 may utilize a flash translation layer or table that translates logical addresses (or logical block addresses) of data stored by memory devices 16 to physical block addresses of data stored by memory devices 16. For example, host device 4 may utilize the logical block addresses of the data stored by memory devices 16 in instructions or messages to storage device 6, while write module 24 utilizes physical block addresses of the data to control writing of data to memory devices 16. (Similarly, read module 28 may utilize physical block addresses to control reading of data from memory devices 16.) The physical block addresses correspond to actual, physical blocks (e.g., blocks 17 of FIG. 2) of memory devices 16.

In this way, host device 4 may be allowed to use a static logical block address for a certain set of data, while the physical block address at which the data is actually stored may change. Address translation module 22 may maintain the flash translation layer or table to map the logical block addresses to physical block addresses to allow use of the static logical block address by the host device 4 while the physical block address of the data may change, e.g., due to wear leveling, garbage collection, or the like.

As discussed above, write module 24 of controller 20 may perform one or more operations to manage the writing of data to memory devices 16. For example, write module 24 may manage the writing of data to memory devices 16 by selecting one or more blocks within memory devices 16 to store the data and causing memory devices of memory devices 16 that include the selected blocks to actually store the data. As discussed above, write module 24 may cause address translation module 22 to update the flash translation layer or table based on the selected blocks. For instance, write module 24 may receive a message from host device 4 that includes a unit of data and a logical block address, select a block within a particular memory device of memory devices 16 to store the data, cause the particular memory device of memory devices 16 to actually store the data (e.g., via a channel controller of channel controllers 32 that corresponds to the particular memory device), and cause address translation module 22 to update the flash translation layer or table to indicate that the logical block address corresponds to the selected block within the particular memory device.

In some instances, the data to be written may be in units that are larger than a single block (i.e., a single physical block) of a memory device of memory devices 16. As such, write module 24 may select multiple blocks, collectively referred to as a logical container, to each store a portion of the unit of data. For instance, write module 24 may define a logical container by selecting multiple blocks from a single memory device of memory devices 16. However, in some examples, it may not be desirable for write module 24 to select all of the blocks of a logical container from a single memory device. For instance, it may not be possible to write to multiple blocks included in a single memory device in parallel.

Therefore, as opposed to defining a logical container by selecting multiple blocks from a single memory device of memory devices 16, write module 24 may define a logical container by selecting blocks from a plurality of memory devices 16. As one example, where NVMA 10 includes 128 of memory devices 16 arranged into sixteen channels that each have eight chip enable (CE) lines/targets, one CE line/target for each of memory devices 16 in a channel (i.e., where channel 18A includes memory devices 16Aa-Ah, . . . , and channel 18P includes memory devices 16Pa-Ph), write module 24 may define a logical container that includes 128 blocks by selecting a block from each of memory devices 16Aa-16Ph. Write module 24 may then cause the plurality of memory devices 16 to store the portions of the unit of data in parallel at the selected blocks. In this way, write module 24 may increase the rate at which data may be stored to memory devices 16 by writing portions of the data to different memory devices 16, e.g., connected to different channels 18. However, in some examples, it may not be desirable for a logical container to include a block from each of memory devices 16.

In accordance with one or more techniques of this disclosure, as opposed to defining a logical container that includes a block from each of memory devices 16, write module 24 may define a blockset that includes a block from each memory device of a sub-set of memory devices 16 that includes at least one memory device from each of channels 18. In some examples, the sub-set of memory devices 16 may be referred to as a die-set. For instance, write module 24 may partition memory devices 16 based on respective CE lines associated with respective ones of memory devices 16 to define a plurality of sub-sets of memory devices 16, each sub-set including at least one memory device (e.g., die) from each of channels 18. For each respective sub-set of the plurality of sub-sets of memory devices 16, write module 24 may define a respective plurality of blocksets, each blockset including a block from each die of the respective sub-set of the plurality of sub-sets of memory devices 16. In this way, e.g., by using blocksets that include fewer blocks, write module 24 may decrease the amount of time needed to erase blocks in a blockset, which may also decrease the latency for blocksets to return to the free resource pool. Also in this way, the amount of time needed for a garbage collection operation to reclaim a blockset may be reduced.

In some examples, in addition to causing the portions of the unit of data to be stored by memory devices 16, write module 24 may cause memory devices 16 to store information which may be used to recover the unit of data should one or more of the blocks fail or become corrupted. For instance, write module 24 may cause memory devices 16 to store parity information in a block within each blockset. The parity information may be used to recover the data stored by other blocks of the blockset. In some examples, the parity information may be an XOR of the data stored by the other blocks.

In order to write a bit with a logical value of 0 (charged) to a bit with a previous logical value of 1 (uncharged), a large current is used. This current may be sufficiently large that it may cause inadvertent changes to the charge of adjacent flash memory cells. To protect against inadvertent changes, an entire block of flash memory cells may be erased to a logical value of 1 (uncharged) prior to writing any data to cells within the block. Because of this, flash memory cells may be erased at the block level and written at the page level.

Thus, to write even an amount of data that would consume less than one page, controller 20 may cause an entire block to be erased. This may lead to write amplification, which refers to the ratio between the amount of data received from host device 4 to be written to memory devices 16 and the amount of data actually written to memory devices 16. Write amplification contributes to faster wearing of the flash memory cells than would occur with no write amplification. Wear to flash memory cells may occur when flash memory cells are erased due to the relatively high voltages used to erase the flash memory cells. Over a plurality of erase cycles, the relatively high voltages may result in changes to the flash memory cells. Eventually, the flash memory cells may wear out, such that data may no longer be written to the cells.

One technique that controller 20 may implement to reduce write amplification and wear of flash memory cells includes writing data received from host device 4 to unused blocks (e.g., blocks 17 of FIG. 2) or partially used blocks. For example, if host device 4 sends data to storage device 6 that includes only a small change from data already stored by storage device 6. The controller then may mark the old data as stale or no longer valid. Over time, this may reduce a number of erase operations blocks are exposed to, compared to erasing the block that holds the old data and writing the updated data to the same block.

Responsive to receiving a write command from host device 4, write module 24 may determine at which physical locations (blocks 17) of memory devices 16 to write the data. For example, write module 24 may request from address translation module 22 or maintenance module 26 one or more physical block addresses that are empty (e.g., store no data), partially empty (e.g., only some pages of the block store data), or store at least some invalid (or stale) data. Upon receiving the one or more physical block addresses, write module 24 may define and/or select one or more blocksets as discussed above, and communicate a message to channel controllers 32A-32N (collectively, "channel controllers 32"), which causes the channel controllers 32 to write the data to the blocks of the blockset.

Read module 28 similarly may control reading of data from memory devices 16. For example, read module 28 may receive a message from host device 4 requesting data with an associated logical block address. Address translation module 22 may convert the logical block address to a physical block address using the flash translation layer or table. Read module 28 then may control one or more of channel controllers 32 to retrieve the data from the physical block addresses. Similar to write module 24, read module 28 may select one or more blocksets and communicate a message to channel controllers 32, which causes the channel controllers 32 to read the data from the blocks of the blockset.

Each channel controller of channel controllers 32 may be connected to a respective channel of channels 18. In some examples, controller 20 may include the same number of channel controllers 32 as the number of channels 18 of storage device 2. Channel controllers 32 may perform the intimate control of addressing, programming, erasing, and reading of memory devices 16 connected to respective channels, e.g., under control of write module 24, read module 28, and/or maintenance module 26.

Maintenance module 26 may be configured to perform operations related to maintaining performance and extending the useful life of storage device 6 (e.g., memory devices 16). For example, maintenance module 26 may implement at least one of wear leveling or garbage collection.

As described above, erasing flash memory cells may use relatively high voltages, which, over a plurality of erase operations, may cause changes to the flash memory cells. After a certain number of erase operations, flash memory cells may degrade to the extent that data no longer may be written to the flash memory cells, and a block (e.g., block 17 of FIG. 2) including those cells may be retired (no longer used by controller 20 to store data). To increase the amount of data that may be written to memory devices 16 before blocks are worn and retired, maintenance module 26 may implement wear leveling.

In wear leveling, maintenance module 26 may track a number of erases of or writes to a block or a group of blocks, for each block or group of blocks. Maintenance module 26 may cause incoming data from host device 4 to be written to a block or group of blocks that has undergone relatively fewer writes or erases, to attempt to maintain the number of writes or erases for each block or group of blocks approximately equal. This may cause each block of memory devices 16 to wear out at approximately the same rate, and may increase the useful lifetime of storage device 6.

Although this may reduce write amplification and wear of flash memory cells by reducing a number of erases and writing data to different blocks, this also may lead to blocks including some valid (fresh) data and some invalid (stale) data. To combat this, maintenance module 26 may implement garbage collection. In a garbage collection operation, maintenance module 26 may analyze the contents of the blocks of memory devices 16 to determine a block that contain a high percentage of invalid (stale) data. Maintenance module 26 then may rewrite the valid data from the block to a different block, and then erase the block. This may reduce an amount of invalid (stale) data stored by memory devices 16 and increase a number of free blocks, but also may increase write amplification and wear of memory devices 16. In some examples, maintenance module 26 may perform garbage collection within each of the plurality of die-sets to generate empty blocks within block-sets. In this way, maintenance module 26 may increase the likelihood that empty blocks or blocksets may be successfully defined within each die-set.

Scheduling module 30 of controller 20 may perform one or more operations to schedule activities to be performed by memory devices 16. For instance, scheduling module 30 may schedule requests received from other components of controller 20 to command one or more of memory devices 16 to perform one or more activities during run-time. In some examples, scheduling module 30 may schedule the requests to be performed in the order in which they were received (e.g., first-in first-out or FIFO). In some examples, scheduling module 30 may schedule the requests based one or more factors which may include, but are not limited to, the type of request (e.g., a read request, a write request, an erase request, a garbage collection request, etc.), an amount of time elapsed since the request was received, an amount of power that would be consumed by performance of the request, bandwidth considerations, and the like. As one example, scheduling module 30 may schedule activities to be performed based on a quantity of memory devices of memory devices 16 that may be concurrently active (e.g., concurrently reading, writing, and/or erasing data). For instance, scheduling module 30 may determine the quantity of memory devices of memory device 16 that may be concurrently active based on a power consumption budget, a performance target, or both. The power consumption budget may indicate an amount of power available for use by memory devices 16. For instance, where storage device 6 has a power target of 25 W, the power consumption budget may allocate a portion of the power target (e.g., 16 W) for use by memory devices 16. However, in some examples, the amount of power that would be consumed if all of memory devices 16 were concurrently active may be greater than the allocated portion of the supplied power. As such, scheduling module 30 may determine a quantity of memory devices 16 that may be currently active without consuming more power than the allocated portion.

For instance, where memory devices 16 are allocated X units of a power consumption budget and each memory device of memory devices 16 uses one unit of power when active, scheduling module 30 may determine that X memory devices of memory devices 16 may be concurrently active. In some examples, such as where a plurality of die-sets are defined from memory devices 16, scheduling module 30 may determine a quantity of die-sets of the plurality of die-sets that may be concurrently active. For instance, where memory devices 16 are allocated X units of a power consumption budget, each memory device of memory devices 16 uses one unit of power when active, and each die-set includes X/2 memory devices of memory devices 16, scheduling module 30 may determine that two die-sets of the plurality of die-sets may be concurrently active.

In order to comply with the power consumption budget, scheduling module 30 may refrain from scheduling activities to be performed by the respective sub-sets of memory devices 16 respectively included in the plurality of die-sets that would cause more of the plurality of die-sets to be concurrently active than the determined quantity of die-sets that may be concurrently active. For example, where scheduling module 30 determines that one die-set of the plurality of die-sets may be concurrently active, scheduling module 30 may schedule activities such that first commands are issued that cause a first die-set of the plurality of die-sets to be active during a first period of time such that an amount of power consumed by memory devices 16 during the first period of time satisfies the power consumption budget, and second commands are issued that cause a second die-set of the plurality of die-sets to be active during a second, different period of time such that an amount of power consumed by memory devices 16 during the second, different period of time also satisfies the power consumption budget. The first die-set may be the same die-set as the second die-set or the first die-set may be a different die-set than the second die-set.

Scheduling module 30 may also determine the quantity of die-sets that may be concurrently active based on one or more performance targets. For instance, scheduling module 30 may schedule the activities such that storage device 6 achieves one or more of a write rate target (e.g., 1.5 GB/s), a read rate target (e.g., 3.0 GB/s), one or more input/output operations per second (TOPS) targets (e.g., sequential read/write, random read/write, and total), and the like.

In some examples, the activities scheduled by scheduling module 30 may take varying amounts of time and/or power to complete. As one example, a write activity may take longer (e.g., 2× longer, 5× longer, 10× longer, etc.) to perform than a read activity. As another example, the amount of power consumed by a memory device of memory devices 16 when performing a write activity may be larger than the amount of power consumed by the a memory device of memory devices 16 when performing a read activity (e.g., 2× more, 5× more, 10× more, etc.). In some examples, scheduling module 30 may utilize these differences when scheduling activities and/or when determining the quantity of die-sets that may be concurrently active. For instance, where performing a read activity consumes less power as performing a write activity, scheduling module 30 may determine that more die-sets may concurrently perform read activities than may concurrently perform write activities. In one or more of these ways, scheduling module 30 may schedule activities to achieve one or more performance targets.

In some examples, the messages received from host device 4 may not be evenly balanced between requests to read data and requests to write data. For instance, a ratio of requests to read data to requests to write data may be 1:0 (i.e., 100% requests to read data), 3:1 (i.e., 75% requests to read data and 25% requests to write data), 1:1 (i.e., 50% requests to read data and 50% requests to write data), 1:3 (i.e., 25% requests to read data and 75% requests to write data), 0:1 (i.e., 0% requests to read data and 100% requests to write data), and anything in between. In some examples, scheduling module 30 may utilize this ratio when scheduling activities and/or when determining the quantity of die-sets that may be concurrently active. For instance, where the amount of time taken to perform a read activity is less than the amount of time taken to perform a write activity, scheduling module 30 may schedule multiple read activities to occur during the same period of time as a single write activity. As such, storage device 6 may realize a higher read rate than write rate. In one or more of these ways, scheduling module 30 may schedule activities to achieve one or more performance targets.

As discussed above, maintenance module 26 may perform one or more maintenance activities, such as garbage collection, on memory devices 16 in order to e.g., increase the number of free blocks/blocksets. As such, in some examples, scheduling module 30 may prioritize garbage collection requests over requests based on messages received from host device 4 (e.g., requests to read and/or write data) by allocating a quantity of die sets that may be concurrently used for garbage collection and allocating a quantity of die-sets that may be concurrently available to host device 4 during a particular period of time.

Based on the determined quantities, scheduling module 30 may schedule activities such that, during a particular period of time, a first set of the die-sets perform activities based on messages received from host device 4 and a second set of the die-sets perform garbage collection activities. In some examples, the first set of the die-sets may include a quantity of die-sets that is less than or equal to the quantity of die-sets that may be concurrently available to the host. In some examples, the second set of the die-sets may include a quantity of die-sets that is less than or equal to a difference between the determined quantity of die-sets that may be concurrently active and a quantity of die-sets that are scheduled to perform activities based on messages received from host device 4 during the particular period of time (i.e., the quantity of die-sets to which the controller issues commands based on the messages received from the host during the particular period of time). In this way, scheduling module 8 may balance the need to perform garbage collection with the amount of bandwidth available to host device 4 while satisfying the power consumption budget.

Additionally, scheduling module 30 may schedule different die-sets to concurrently perform different activities (e.g., reading, writing, and erasing). For instance, as opposed to scheduling all of the die-sets to concurrently perform a write activity, scheduling module 30 may concurrently schedule a first die-set to perform a read activity, a second die-set to perform a write activity, a third die-set to perform an erase activity, and a fourth die-set to be idle. In this way, e.g., by partitioning memory devices 16 into a plurality of die-sets, techniques of this disclosure may enable scheduling module 30 to efficiently schedule different types of operations/activities.

Figure 4:
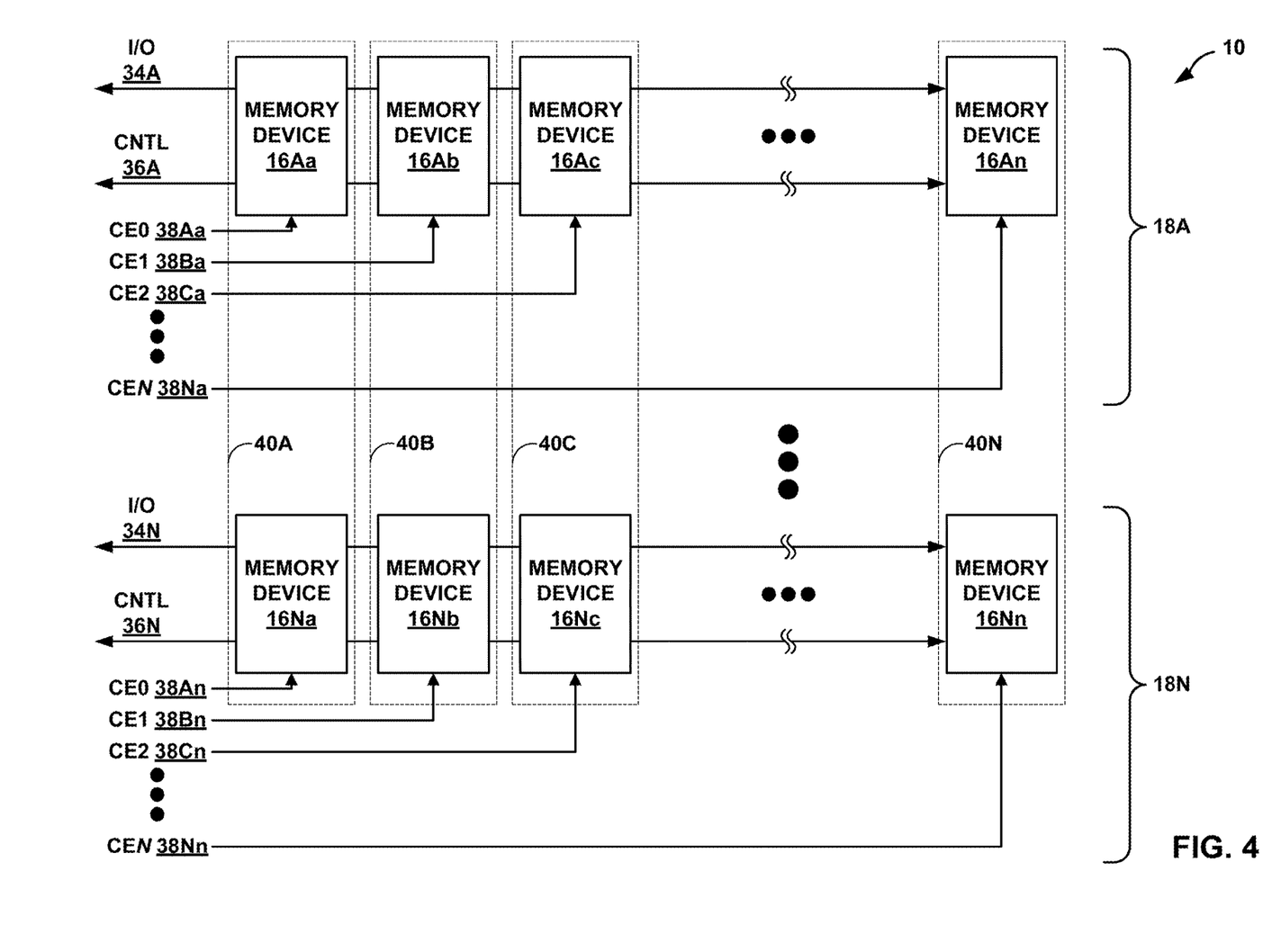
FIG. 4 is a conceptual block diagram illustrating an example non-volatile memory array that includes a plurality memory devices arranged into a plurality of channels, in accordance with one or more techniques of this disclosure.

FIG. 4 is a conceptual and schematic diagram illustrating further details of an example non-volatile memory array 10 of FIG. 1, in accordance with one or more techniques of this disclosure. As discussed above, memory devices 16 may be grouped into channels 18 and the memory devices of memory devices 16 on each channel may share one or more connections to controller 8. For instance, the memory devices 16 grouped into a respective channel of channels 18 may be attached to a respective common I/O bus of I/O buses 34A-34N (collectively, "I/O buses 34") and a respective common control bus of control busses 36A-36N (collectively, "control buses 36"). As illustrated in FIG. 4, memory devices 16Aa-16An of channel 18A may each be attached to I/O bus 34A and control bus 36A.

In some examples, each respective I/O bus of I/O buses 34 may include a plurality of bidirectional I/O lines (e.g., 8 lines, 16 lines, etc.) that may be used to exchange address information, data, and instruction information between controller 8 and memory devices 16 attached to the respective I/O bus. In some examples, each respective control bus of control buses 36 may include a plurality of lines that may be used to exchange control signals, and status information between controller 8 and memory devices 16 attached to the respective control bus. For instance, an example control bus of control buses 36 may include an address latch enable (ALE) line, a command latch enable (CLE) line, a read-enable (RE) line, a write-enable (WE) line, and a write-protect (WP) line that may be used by controller 8 to send commands to a memory device of memory devices 16; and a ready/busy (R/B) line that may be used by a memory device of memory devices 16 to send status information to controller 8.

As discussed above, each of channels 18 may include a set of chip enable (CE) lines which may be used to multiplex memory devices on each channel. For example, as illustrated in FIG. 4, CE lines 38Aa-38Na may be used to multiplex memory devices 16Aa-16An of channel 18A. For instance, to send a message to memory device 16Aa, controller 8 may send a signal via CE0 38Aa that causes memory device 16Aa to "listen" to one or both of the signals on I/O bus 34A and the signals on control bus 36A. Controller 8 may then issue a command to memory device 16Aa by outputting signals on one or both of I/O bus 34A and control bus 36A. In this way, controller 8 may multiplex memory devices of memory devices 16 within a particular channel of channels 18.

In accordance with one or more techniques of this disclosure, controller 8 may define a blockset that includes a block from each memory device of a sub-set (or die-set) of memory devices 16 that includes at least one memory device from each of channels 18. As discussed above and illustrated in FIG. 4, controller 8 may partition memory devices 16 to define die-sets 40A-40N (collectively, "die-sets 40") that each include at least one memory device (e.g., die) from each of channels 18. In some examples, controller 8 may partition memory devices 16 into die-sets 40 based on CE lines associated with memory devices 16. For instance, controller 8 may partition all of the dies physically located on a particular CE line (i.e., CE0 on each of channels 18) into a particular (or selected) die-set of die-sets 40. As one example, controller 8 may partition memory devices of memory devices 16 physically located on CE0 of each channel (i.e., memory devices 16Aa, 16Ba, . . . , and 16Na) into die-set 40A. In some examples, controller 8 may partition memory devices 16 into die-sets 40 based on other arrangements. For instance, controller 8 may partition memory devices of memory devices 16 physically located on varying CEs of each channel (i.e., memory devices 16Aa, 16Bc, . . . , and 16Nb) into a die-set. Further details of an example die-set 40A of die-sets 40 are discussed below with respect to the conceptual diagram illustrated in FIG. 5.

Figure 5:
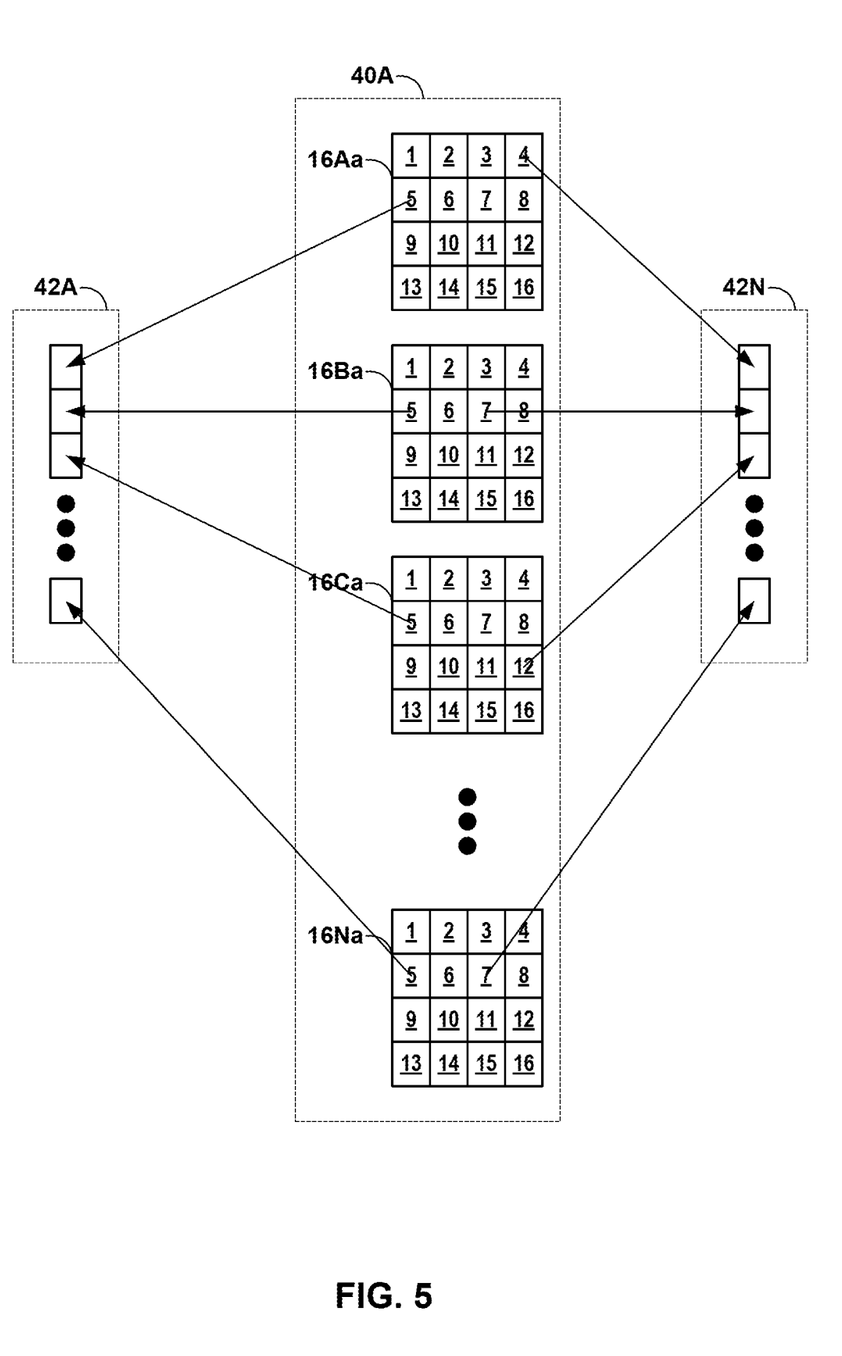
FIG. 5 is a conceptual block diagram illustrating an example technique that may be performed by a controller of a storage device to define blocksets from a die-set, in accordance with one or more techniques of this disclosure.

As illustrated in FIG. 5, each memory device 16Aa-16Na of die-set 40A includes 16 blocks. Although 16 blocks are illustrated for each of memory devices 16Aa-16Na in the example of FIG. 5, in other examples, each of memory devices 16Aa-16Na may include more blocks. From the plurality of memory devices 16Aa-16Na in die-set 40A, controller 8 may define a plurality of blocksets 42A-42N (collectively, "blocksets 42"). Each blockset of blocksets 42 may include a block (e.g., a single block) from each die of the die-set 40A.

In some examples, controller 8 may select a block from a particular location within memory devices 16Aa, 16Ba, . . . , and 16Na to define a blockset of blocksets 42. For example, as illustrated in FIG. 5, each block included in blockset 42A is from a respective location 5 of each of memory devices 16Aa, 16Ba, . . . , and 16Na. In some examples, controller 8 may select block from varying locations within memory devices 16Aa, 16Ba, . . . , and 16Na to define a blockset of blocksets 42. For example, as illustrated in FIG. 5, blockset 42B may include block 4 from memory device 16Aa, block 7 from memory device 16Ba, block 12 from memory device 16Ca, . . . , and block 7 from memory device 16Na. In some examples, such as where it is no longer desirable to use a block at a particular location of a memory device (e.g., where the block has failed, has a relatively large write/erase cycle count compared to other blocks of the same memory device, etc.), controller 8 may continue to select blocks at the particular location (or a different location) from other memory devices within die-set 40A to define blocksets.

Figure 6:
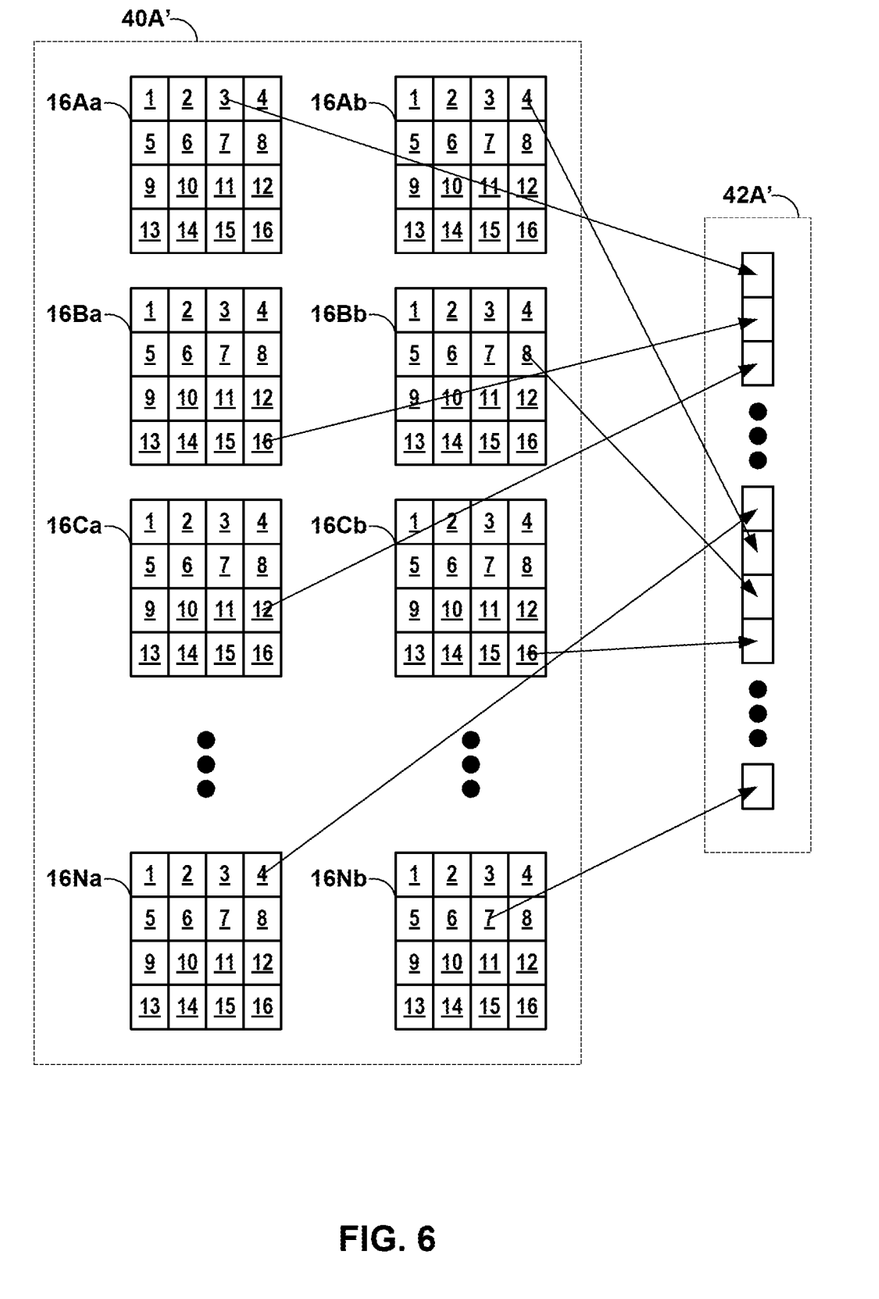
FIG. 6 is a conceptual block diagram illustrating another example technique that may be performed by a controller of a storage device to define blocksets from a die-set, in accordance with one or more techniques of this disclosure.

In some examples, controller 8 may define the blocksets using a virtualized arrangement of memory devices 16 within NVMA 10. For instance, as opposed to selecting a single memory device of memory devices 16 from each of physical channels 18, controller 8 may select multiple memory devices of memory devices 16 from each of physical channels 18 to define a die-set of die-sets 40. In particular, controller 8 may select memory devices of memory devices 16 attached to different CE lines within each of physical channels 18 to define a die-set of die-sets 40. For example, FIG. 6 is a conceptual block diagram illustrating another example technique that may be performed by a controller of a storage device to define blocksets from a die-set, in accordance with one or more techniques of this disclosure. As illustrated in the example of FIG. 6, controller 8 may define die-set 40A' by selecting memory devices 16Aa, 16Ba, 16Ca, . . . , and 16Na and memory devices 16Ab, 16Bb, 16Cb, . . . , and 16Nb. Additionally, as discussed above with reference to FIG. 4, memory devices 16Aa, 16Ba, 16Ca, . . . , and 16Na may be connected to a first set of chip enable lines, e.g., CE0 38Aa-38An, and memory devices 16Ab, 16Bb, 16Cb, . . . , and 16Nb may be connected to a second set of chip enable lines, e.g., CE1 38Ba-38Bn.

Within each die-set of die-sets 40, controller 8 may respectively map the memory devices of memory devices 16 that are attached to each of channels 18 to a plurality of virtual channels. In the example of FIG. 6, controller 8 may map memory devices 16Aa, 16Ba, 16Ca, . . . , and 16Na to a first set of virtual channels and map memory devices 16Ab, 16Bb, . . . , and 16Nb to a second set of virtual channels, e.g., based on the CE enable lines to which memory devices 16Aa, 16Ba, 16Ca, . . . , and 16Na; and memory devices 16Ab, 16Bb, . . . , and 16Nb are connected, respectively. In this way, controller 8 may define a greater quantity of virtual channels that the quantity of physical channels to which memory devices 16 are actually attached. In some examples, this may allow controller 8 or 20 to access increased parallelism of memory devices 16.

Controller 8 may then define blocksets 42 using the techniques described above. For example, for a particular die-set of die-sets 40, controller 8 may define a plurality of blocksets 42 that may each include a block from each die of the particular (or selected) die-set. Where the particular die-set includes memory devices of memory devices 16 attached to different CE lines within each of physical channels 18, controller 8 may define a blockset of blocksets 42 by selecting a block from each memory device of memory devices 16 that is attached to a different CE line within each of physical channels 18. As illustrated in the example of FIG. 6, controller 8 may define blockset 42A' by selecting a block from each of memory devices 16Aa, 16Ba, 16Ca, . . . , and 16Na and each of memory devices 16Ab, 16Bb, 16Cb, . . . , and 16Nb.

Figure 7:
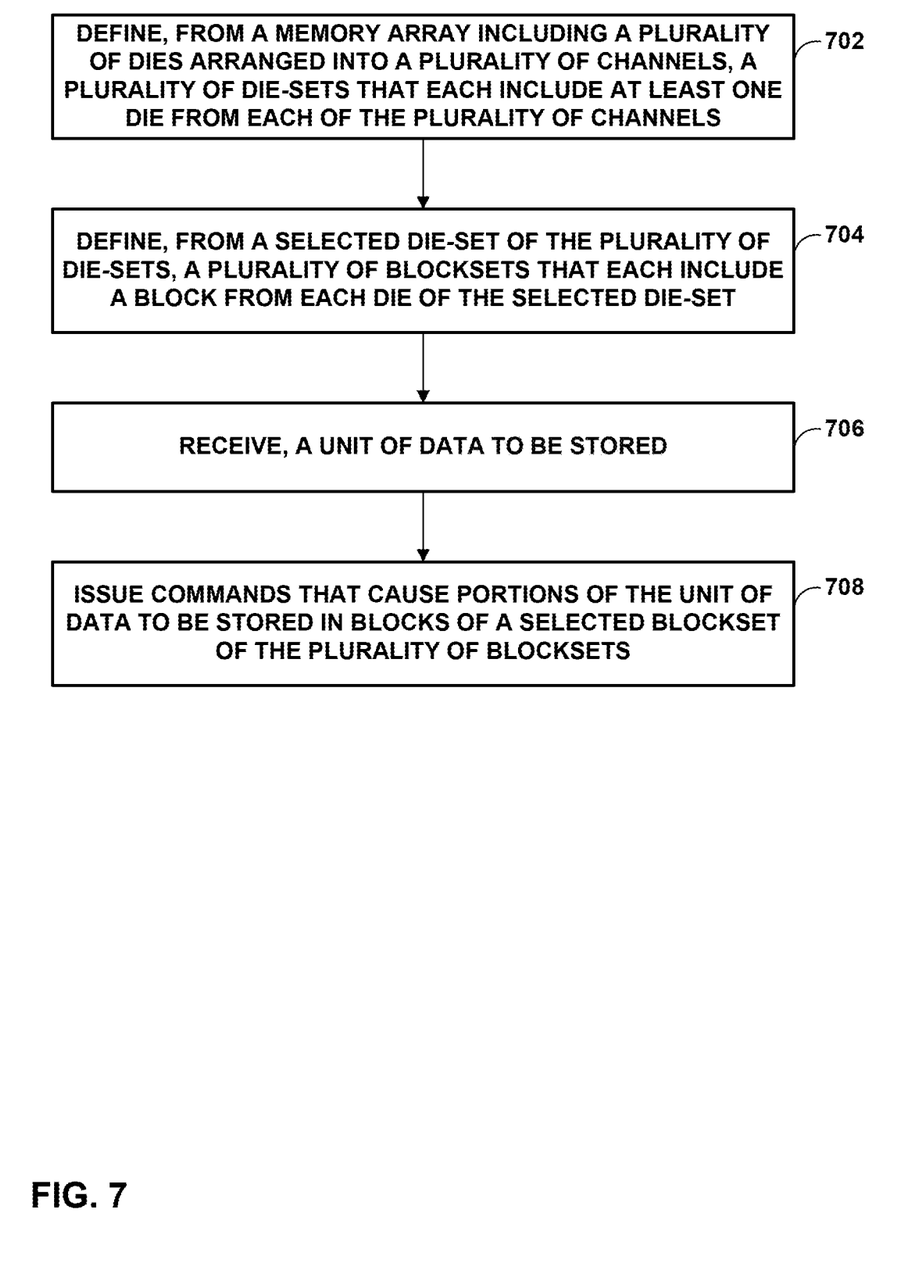
FIG. 7 is a flow diagram illustrating an example technique for managing a storage device using blocksets, in accordance with one or more techniques of this disclosure.

FIG. 7 is a flow diagram illustrating an example technique for defining die-sets and blocksets within a storage device, in accordance with one or more techniques of this disclosure. The technique of FIG. 7 will be described with concurrent reference to storage device 6 and controller 8 of FIG. 1 and controller 20 of FIG. 3 for ease of description, although computing devices having configurations different than that of storage device 6, controller 8, or controller 20 may perform the techniques of FIG. 7.

In accordance with one or more techniques of this disclosure, controller 8 may define, from a memory array (e.g., NVMA 10) including a plurality of dies (e.g., memory devices 16) arranged into a plurality of channels (e.g., channels 18), a plurality of die-sets that each include at least one die from each of the plurality of channels (702). For instance, write module 24 of controller 20 may define a plurality of die-sets 40 in accordance with the techniques described above with reference to FIG. 4. In some examples, write module 24 may define the plurality of die-sets by receiving program instructions that indicate the partitioning of memory devices 16 into die-sets 40.

Controller 8 may define, from a selected die-set of the plurality of die-sets, a plurality of blocksets that each include a block from each die of the selected die-set (704). As one example, write module 24 may define a plurality of blocksets 42 from die-set 40A that that each include a block from each die of die-set 40A in accordance with the techniques described above with reference to FIG. 5. In some examples, controller 8 may redefine one or more of the plurality of blocksets based on status information of the blocks. For instance, where a particular block of a particular memory device fails, controller 8 may select another block from the particular memory device to re-define a blockset that included the particular block.

Controller 8 may receive a unit of data to be stored (706). For instance, controller 8 may receive message from a host device, such as host device 4 of FIG. 1, that includes a logical block address and the unit of data to be stored.

Controller 8 may issue commands that cause portions of the unit of data to be stored in blocks of a selected blockset of the plurality of blocksets (708). For example, write module 24 of controller 8 may divide the unit of data into a plurality of respective portions and issue commands that cause memory devices of memory devices 16 that include respective blocks of the particular blockset to store the respective portions of the unit of data.

In this way, e.g., by concurrently writing the respective portions of the data to the respective blocks of memory devices on different channels, controller 8 may improve throughput using parallelism. Also in this way, controller 8 may reduce the number of blocks included in the basic units of the logical management domain, e.g., without compromising potential throughput.

The following examples may illustrate one or more of the techniques of this disclosure.

Example 1

A method comprising: defining, from a memory array including a plurality of dies arranged into a plurality of channels, a plurality of die-sets based on respective chip enable lines associated with the plurality of dies, wherein each die-set of the plurality of die-sets includes at least one die from each of the plurality of channels; defining, from a selected die-set of the plurality of die-sets, a plurality of blocksets, wherein each blockset includes a block from each die of the selected die-set; receiving, by a controller of the memory array, a unit of data to be stored; and issuing, by the controller, commands that cause the unit of data to be stored in blocks of a selected blockset of the plurality of blocksets.

Example 2

The method of example 1, further comprising: determining, by the controller, a quantity of die-sets that may be concurrently active; issuing, by the controller, commands to a set of the plurality of die-sets that includes a number of die-sets that is less than or equal to the quantity of die-sets that may be concurrently active; and refraining, by the controller, from issuing commands that would cause more of the plurality of die-sets to be concurrently active than the quantity of die-sets that may be concurrently active.

Example 3

The method of any combination of examples 1-2, further comprising: issuing, by the controller, first commands that cause a first sub-set of the plurality of die-sets to be active during a first period of time such that an amount of power consumed by the memory array during the first period of time is less than or equal to a power consumption budget; and issuing, by the controller, second commands that cause a second sub-set of the plurality of die-sets to be active during a second period of time such that an amount of power consumed by the memory array during the second period of time also less than or equal to the power consumption budget.

Example 4

The method of any combination of examples 1-3, wherein the second sub-set includes at least one die-set of the plurality of die-sets not included in the first sub-set such that dies of the at least one die-set are active during the second period of time but not active during the first period of time.

Example 5

The method of any combination of examples 1-4, wherein issuing the first commands comprises: issuing a first command from a command set to dies of a first die-set of the first sub-set, wherein the command set includes a read command, a write command, and an erase command; and issuing a second, different, command from the command set to dies of a second die-set of the first sub-set.

Example 6

The method of any combination of examples 1-5, wherein determining the quantity of die-sets to be concurrently active comprises: determining the quantity of die-sets that may be concurrently active during run-time and based on at least one of a power consumption budget or a performance target.

Example 7

The method of any combination of examples 1-6, further comprising: performing garbage collection within the plurality of die-sets to generate empty block-sets.

Example 8

The method of any combination of examples 1-7, wherein determining the quantity of die-sets that may be concurrently active comprises determining a first quantity of die-sets that may be concurrently active during a particular period of time, the method further comprising: determining, by the controller, a second quantity of die-sets that may be concurrently available to a host during the particular period of time, wherein the second quantity of die-sets is less than or equal to the first quantity of die-sets; issuing, by the controller and based on messages received from the host, commands to a first set of die-sets of the plurality of die-sets that includes a number of die-sets that is less than or equal to the second quantity of die-sets; determining a difference between the first quantity of die-sets and the number of die-sets to which the controller issued commands based on the messages received from the host; and performing garbage collection on a second set of die-sets of the plurality of die-sets that includes a quantity of die-sets that is less than or equal to the determined difference.

Example 9

The method of any combination of examples 1-8, further comprising: defining the particular die-set by at least selecting a single die of the plurality of dies from each of the plurality of channels.

Example 10

The method of any combination of examples 1-9, wherein the plurality of channels include N physical channels, the method further comprising: defining the selected die-set by at least selecting, from each of the plurality of channels, at least two of the plurality of dies that are associated with different chip enable lines; and mapping the selected dies to M virtual channels where M is an integer at least twice as large as N.

Example 11

A storage device comprising: a memory array including a plurality of dies arranged into a plurality of channels; and a controller configured to: define, from the memory array, a plurality of die-sets based on respective chip enable lines associated with the plurality of dies, wherein each die-set of the plurality of die-sets includes at least one die from each of the plurality of channels; define, from a selected die-set of the plurality of die-sets, a plurality of blocksets, wherein each blockset includes a block from each die of the selected die-set; receive a unit of data to be stored; and issue commands that cause the unit of data to be stored in blocks of a selected blockset of the plurality of blocksets.

Example 12

The storage device of example 11, wherein the controller is further configured to perform the method of any combination of examples 1-10.

Example 13

A computer-readable storage medium storing instructions that, when executed, cause one or more processors of a storage device to: define, from a memory array including a plurality of dies arranged into a plurality of channels, a plurality of die-sets based on respective chip enable lines associated with the plurality of dies, wherein each die-set of the plurality of die-sets includes at least one die from each of the plurality of channels; define, from a selected die-set of the plurality of die-sets, a plurality of blocksets, wherein each blockset includes a block from each die of the selected die-set; receive a unit of data to be stored; and issue commands that cause the unit of data to be stored in blocks of a selected blockset of the plurality of blocksets.

Example 14

The computer-readable storage medium of example 13, further storing instructions that, when executed, cause one or more processors of the storage device to perform the method of any combination of examples 1-10.

Example 15

A system comprising: means for defining, from a memory array including a plurality of dies arranged into a plurality of channels, a plurality of die-sets based on respective chip enable lines associated with the plurality of dies, wherein each die-set of the plurality of die-sets includes at least one die from each of the plurality of channels; means for defining, from a selected die-set of the plurality of die-sets, a plurality of blocksets, wherein each blockset includes a block from each die of the selected die-set; means for receiving a unit of data to be stored; and means for issuing commands that cause the unit of data to be stored in blocks of a selected blockset of the plurality of blocksets.

Example 16

The system of example 15, further comprising means for performing the method of any combination of examples 1-10.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A storage device comprising:
a memory array including a plurality of memory devices arranged into a plurality of channels; and
a controller configured to:
identify, from the memory array, a plurality of device-sets, wherein each device-set of the plurality of device-sets includes at least one memory device from each of the plurality of channels;
identify, from a selected device-set of the plurality of device-sets, a plurality of blocksets, wherein each blockset includes a block selected from a respective plurality of blocks within each memory device of the selected device-set; and
issue instructions that cause received data to be stored in blocks of a selected blockset of the plurality of blocksets.

2. The storage device of claim 1, wherein the controller is further configured to:
determine a quantity of device-sets that may be concurrently active;
issue commands to a set of the plurality of device-sets that includes a number of device-sets that is less than or equal to the quantity of device-sets that may be concurrently active; and
prevent issuing of additional instructions that would cause more of the plurality of device-sets to be concurrently active than the quantity of device-sets that may be concurrently active.

3. The storage device of claim 2, wherein the controller is configured to determine the quantity of device-sets to be concurrently active by at least:
determining the quantity of device-sets that may be concurrently active during run-time and based on at least one of a power consumption budget or a performance target.

4. The storage device of claim 2, wherein the controller is configured to determine the quantity of device-sets that may be concurrently active by at least determining a first quantity of device-sets that may be concurrently active during a particular period of time, and wherein the controller is further configured to:
determine a second quantity of device-sets that may be concurrently available to a host during the particular period of time, wherein the second quantity of device-sets is less than or equal to the first quantity of device-sets;
issue, based on messages received from the host, commands to a first set of device-sets of the plurality of device-sets that includes a number of device-sets that is less than or equal to the second quantity of device-sets;
determine a difference between the first quantity of device-sets and the number of device-sets to which the controller issued commands based on the messages received from the host; and perform garbage collection on a second set of device-sets of the plurality of device-sets that includes a quantity of device-sets that is less than or equal to the determined difference.

5. The storage device of claim 1, wherein the controller is further configured to:
issue first commands that cause a first sub-set of the plurality of device-sets to be active during a first period of time such that an amount of power consumed by the memory array during the first period of time is less than or equal to a power consumption budget; and
issue second commands that cause a second sub-set of the plurality of device-sets to be active during a second period of time such that an amount of power consumed by the memory array during the second period of time also less than or equal to the power consumption budget.

6. The storage device of claim 5, wherein the second sub-set includes at least one device-set of the plurality of device-sets not included in the first sub-set such that memory devices of the at least one device-set are active during the second period of time but not active during the first period of time.

7. The storage device of claim 6, wherein the controller is configured to issue the first commands by at least:
issuing a first command from a command set to memory devices of a first device-set of the first sub-set, wherein the command set includes a read command, a write command, and an erase command; and
issuing a second, different, command from the command set to memory devices of a second device-set of the first sub-set.

8. The storage device of claim 1, wherein the controller is further configured to:
perform garbage collection within the plurality of device-sets to generate empty block-sets.

9. The storage device of claim 1, wherein the controller is further configured to:
identify a particular device-set by at least selecting a single memory device of the plurality of memory devices from each of the plurality of channels.

10. The storage device of claim 1, wherein the plurality of channels include N physical channels, and wherein the controller is further configured to:
identify the selected device-set by at least selecting, from each of the plurality of channels, at least two of the plurality of memory devices that are associated with different chip enable lines; and
map the selected memory devices to M virtual channels where M is an integer at least twice as large as N.

11. The storage device of claim 1, wherein the controller is configured to identify, from the memory array, the plurality of device-sets based on respective chip enable lines associated with the plurality of memory devices.

12. A method comprising:
identifying, from a memory array including a plurality of memory devices arranged into a plurality of channels, a plurality of device-sets, wherein each device-set of the plurality of device-sets includes at least one memory device from each of the plurality of channels;
identifying, from a selected device-set of the plurality of device-sets, a plurality of blocksets, wherein each blockset includes a block selected from a respective plurality of blocks within each memory device of the selected device-set; and issuing, by a controller of the memory array, instructions that cause received data to be stored in blocks of a selected blockset of the plurality of blocksets.

13. The method of claim 12, further comprising:
   determining, by the controller, a quantity of device-sets that may be concurrently active;
   issuing, by the controller, commands to a set of the plurality of device-sets that includes a number of device-sets that is less than or equal to the quantity of device-sets that may be concurrently active; and
   preventing, by the controller, issuing of additional instructions that would cause more of the plurality of device-sets to be concurrently active than the quantity of device-sets that may be concurrently active.

14. The method of claim 13, wherein determining the quantity of device-sets that may be concurrently active comprises determining a first quantity of device-sets that may be concurrently active during a particular period of time, the method further comprising:
   determining, by the controller, a second quantity of device-sets that may be concurrently available to a host during the particular period of time, wherein the second quantity of device-sets is less than or equal to the first quantity of device-sets;
   issuing, by the controller and based on messages received from the host, commands to a first set of device-sets of the plurality of device-sets that includes a number of device-sets that is less than or equal to the second quantity of device-sets;
   determining a difference between the first quantity of device-sets and the number of device-sets to which the controller issued commands based on the messages received from the host; and
   performing garbage collection on a second set of device-sets of the plurality of device-sets that includes a quantity of device-sets that is less than or equal to the determined difference.

15. The method of claim 12, further comprising:
   issuing, by the controller, first commands that cause a first sub-set of the plurality of device-sets to be active during a first period of time such that an amount of power consumed by the memory array during the first period of time is less than or equal to a power consumption budget; and
   issuing, by the controller, second commands that cause a second sub-set of the plurality of device-sets to be active during a second period of time such that an amount of power consumed by the memory array during the second period of time also less than or equal to the power consumption budget.

16. The method of claim 15, wherein issuing the first commands comprises:
   issuing a first command from a command set to memory devices of a first device-set of the first sub-set, wherein the command set includes a read command, a write command, and an erase command; and
   issuing a second, different, command from the command set to memory devices of a second device-set of the first sub-set.

17. The method of claim 12, wherein identifying the plurality of device-sets is based on respective chip enable lines associated with the plurality of memory devices.

18. A system comprising:
   means for identifying, from a memory array including a plurality of memory devices arranged into a plurality of channels, a plurality of device-sets, wherein each device-set of the plurality of device-sets includes at least one memory device from each of the plurality of channels;
   means for identifying, from a selected device-set of the plurality of device-sets, a plurality of blocksets, wherein each blockset includes a block selected from a respective plurality of blocks within each memory device of the selected device-set; and
   means for issuing instructions that cause received data to be stored in blocks of a selected blockset of the plurality of blocksets.

19. The system of claim 18, further comprising:
   means for determining a quantity of device-sets that may be concurrently active;
   means for issuing commands to a set of the plurality of device-sets that includes a number of device-sets that is less than or equal to the quantity of device-sets that may be concurrently active; and
   means for preventing issuing of additional commands that would cause more of the plurality of device-sets to be concurrently active than the quantity of device-sets that may be concurrently active.

20. The system of claim 18, wherein the means for identifying the plurality of device-sets is configured to identify the plurality of device-sets based on respective chip enable lines associated with the plurality of memory devices.

* * * * *